US007888662B2

(12) United States Patent
Biloiu et al.

(10) Patent No.: US 7,888,662 B2
(45) Date of Patent: Feb. 15, 2011

(54) ION SOURCE CLEANING METHOD AND APPARATUS

(75) Inventors: Costel Biloiu, Rockport, MA (US);
Craig R. Chaney, Rockport, MA (US);
Eric R. Cobb, Danvers, MA (US);
Bon-Woong Koo, Andover, MA (US);
Wilhelm P. Platow, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 418 days.

(21) Appl. No.: 12/143,247

(22) Filed: Jun. 20, 2008

(65) Prior Publication Data

US 2009/0314951 A1 Dec. 24, 2009

(51) Int. Cl.
*H01J 37/08* (2006.01)
(52) U.S. Cl. .................. 250/492.21; 250/423 R; 250/424; 315/111.81; 134/1.1; 134/1.3; 118/723 R
(58) Field of Classification Search ........................ None
See application file for complete search history.

(56) References Cited

U.S. PATENT DOCUMENTS 5,554,854 A 9/1996 Blake
6,812,648 B2 * 11/2004 Luten et al. ............ 315/111.81
7,531,819 B2 * 5/2009 DiVergilio et al. ...... 250/492.21
2002/0000523 A1 * 1/2002 Ng et al. ................. 250/492.21
2006/0086376 A1 4/2006 Dimeo, Jr. et al.
2007/0137671 A1 6/2007 DiVergilio et al.

FOREIGN PATENT DOCUMENTS

JP   2004-076140 A    3/2004
WO   2004/000828     1/2004
WO   2005/059942     6/2005
WO   2007076004 A2   7/2007

* cited by examiner

*Primary Examiner*—Jack I Berman

(57) ABSTRACT

In a cleaning process for an ion source chamber, an electrode positioned outside of the ion source chamber includes a suppression plug. When the cleaning gas is introduced into the source chamber, the suppression plug may engage an extraction aperture of the source chamber to adjust the gas pressure within the chamber to enhance chamber cleaning via. plasma-enhanced chemical reaction. The gas conductance between the source chamber aperture and the suppression plug can be adjusted during the cleaning process to provide optimum cleaning conditions and to exhaust unwanted deposits.

20 Claims, 3 Drawing Sheets

ION SOURCE CLEANING METHOD AND APPARATUS

BACKGROUND OF THE INVENTION

1. Field of the Invention

Embodiments of the invention relate to the field of semiconductor device fabrication. More particularly, the present invention relates to an apparatus and method for cleaning an ion source chamber used in ion implantation equipment.

2. Discussion of Related Art

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. An ion implanter generally includes an ion source chamber which generates ions of a particular species, a series of beam line components to control the ion beam and a platen to secure the wafer that receives the ion beam. The beam line components may include a series of electrodes to extract the ions from the source chamber, a mass analyzer configured with a particular magnetic field such that only the ions with a desired mass-to-charge ratio are able to travel through the analyzer, and a corrector magnet to provide a ribbon beam which is scanned over a wafer surface orthogonally with respect to the ion beam to implant the ions into the wafer substrate. The ions lose energy when they collide with electrons and nuclei in the substrate and come to rest at a desired depth within the substrate based on the acceleration energy.

An ion source chamber typically includes a heated filament which ionizes a feed gas introduced into the chamber to form charged ions and electrons (plasma). The heating element may be, for example, an indirectly heated cathode (IHC). Different feed gases are supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For ultra-shallow ion implantation, heavier charged molecules such as decaborane, carborane, etc. are introduced into the source chamber at a lower chamber temperature which preserves the molecular structure of the ionized molecules having lower implant energies. Low implant energies typically have values below 20 keV. Certain ion chambers may be configured to provide either mono-atoms or heavy molecular species by using different feed gases and extraction components. Alternatively, certain ion chambers may be configured to supply both high implant energy mono-atoms as well as low energy implant molecules for implantation into a semiconductor substrate through the use of various extraction components. However, when a particular feed gas is supplied to the source chamber to produce a desired ion species, additional unwanted species, either ions or neutrals, may also be produced. These unwanted species typically have a very low vapor pressure and may condense and adhere to the interior surfaces of the source chamber. For example, when phosphine ($PH_3$) is fed into the source chamber, phosphorous (P) deposits may form on the chamber walls. When heavy molecules such as decaborane and carborane are fed into the source chamber, unwanted deposits on the source chamber walls and electrodes is more prevalent. These solid deposits may change the electrical characteristics (voltage instability) of the chamber walls and possibly interfere with the chamber aperture from which the ions are extracted, thereby causing unstable source operation and non-uniform beam extraction. In addition, dopant cross contamination may occur when the use of one type of feed gas in a cycle contaminates the source chamber for subsequent cycles using a different feed gas. Source chambers that generate mono-atoms may run for a week or more before cleaning is necessary. Conversely, source chambers that generate heavier molecular species may require cleaning after just a few hours of operation. Thus, source chambers that operate in dual mode (mono-atom and molecular species) may require more frequent cleaning.

One method used to clean the ion source chamber includes the introduction of a cleaning gas such as, for example nitrogen triflouride ($NF_3$) or sulfur hexaflouride ($SF_6$) which etches away the unwanted deposited material via plasma-enhanced chemical reaction and exits the source chamber as a gas. Introduction of theses cleaning gases is performed in situ and may be introduced simultaneously with the dopant species or as a separate cleaning plasma during equipment down time and/or between specie changes. In order to provide stable source operation and avoid cross-contamination, as much as 4-5 cleaning cycles may be required to remove certain unwanted deposits. Thus, it is desirable to enhance chamber cleaning to increase efficiency and unnecessary equipment downtime. The cleaning process can be tuned by altering the temperature of the reaction in the chamber and the flow rate of the feed gas. In addition, increasing the pressure inside the chamber during the cleaning cycle is another method to enhance the cleaning process. Plasma reaction at higher pressures normally promotes the production of active neutral species (e.g. F*) which is an effective deposit etchant. However, it is difficult to increase the pressure in the source chamber to sufficiently high levels because of the loss of gas, for example, through the source chamber aperture. Moreover, the aperture can not be reduced to increase chamber pressure during cleaning because the extraction current is proportional to the aperture area which is particularly important for molecular beam extraction processing.

SUMMARY OF THE INVENTION

Exemplary embodiments of the present invention are directed to an apparatus and method for cleaning an ion source chamber in an ion implanter. In an exemplary embodiment, an ion implanter includes an ion source chamber having interior surfaces and an aperture through which ion beams are extracted. The ion source chamber is configured to receive a cleaning gas for removing deposits formed on the interior surfaces of the chamber. An electrode, positioned outside of the ion source chamber proximate to the aperture includes at least one slot which provides an extraction path for the ion beam exiting the source chamber aperture. A suppression plug is disposed on the electrode but distal from the slot. The electrode is configured to be displaced with respect to the ion source aperture wherein in a first position the suppression plug allows the ion beam to be extracted through the slot uninhibited and in a second position wherein the suppression plug inhibits, at least partially, the extraction of the ion beam from the source chamber aperture to increase pressure within the chamber. In this manner, the pressure within the ion source chamber increases as the flow rate of the cleaning gas is introduced into the chamber, therefore enhancing cleaning efficiency via plasma-enhanced chemical reaction.

DESCRIPTION OF EMBODIMENTS

Figure 1:
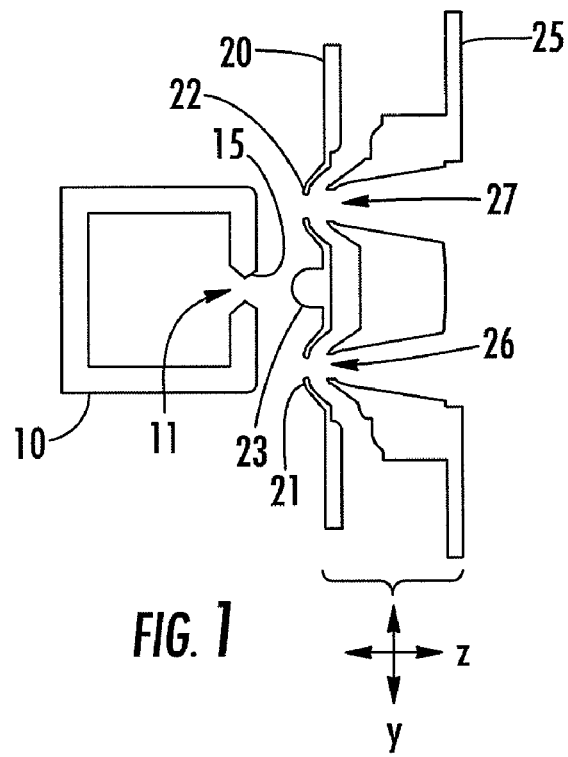
FIG. 1 is a cross sectional block diagram of an ion source and extraction electrodes having a suppression plug disposed thereon in accordance with an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a cross sectional block diagram generally illustrating an ion source chamber 10 used to generate ions for implantation into a substrate. Chamber 10 includes a heated filament (not shown) which ionizes a feed gas introduced into the chamber to form ions and electrons (plasma). Source chamber 10 includes an aperture 11 through which ions can be extracted. The ions are extracted from source chamber 10 via a standard three (3) electrode configuration comprising arc slot electrode 15, suppression electrode 20 and ground electrode 25 used to create an electric field. Although suppression electrode 20 is shown in FIGS. 1-6 as being spaced apart from ground electrode 25, this is for illustrative purposes only and the electrodes are physically in contact with each other via insulators. Arc slot electrode 15 may be biased at the same large potential as ion source chamber 10. Suppression electrode 20 is connected to a power supply and is typically biased at a moderate negative value to prevent electrons from entering back into source chamber 10. Ground electrode 25 is positioned downstream from suppression electrode 20 and is at ground potential. The strength of the electric field generated by the electrodes can be tuned to a desired beam current to extract a particular type of ion beam from the ions generated in chamber 10.

Electrodes 20 and 25 may be dual mode electrodes such that they can be used for both high and low energy implant applications. In particular, suppression electrode 20 includes a plurality of slots 21, 22 through which ions created in source chamber 10 pass. Slot 21 may be configured to optimize the low energy (LE) ion extraction while slot 22 may be configured to optimize the high energy (HE) ion extraction. Similarly, ground electrode 25 includes slots 26 and 27 which may be configured for low energy ion extraction and high energy ion extraction respectively. The distance between chamber aperture 11 and either slots 21 or 22 is called the extraction gap which may be adjusted depending on the desired ion species to be extracted. Electrodes 20 and 25 may be displaced in the y-z plane with reference to source chamber 10 to extract the maximum amount of ion beam current through either the HE or LE slots. This displacement of electrodes 20 and 25 may be performed using an actuator, controller and user interface system (not shown).

Figure 2:
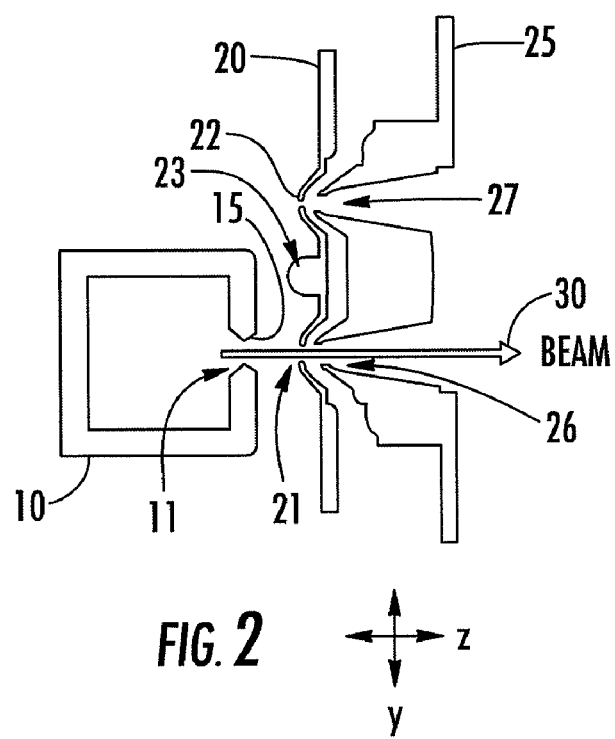
FIG. 2 is a cross sectional block diagram illustrating an ion beam extracted from the ion source in accordance with an embodiment of the present invention.

When a high energy beam is extracted, suppression electrode 20 and ground electrode 25 are displaced in the y direction to align slot 22 of suppression electrode 20 and slot 27 of ground electrode 25 with chamber aperture 11. When low energy beam is extracted, suppression electrode 20 and ground electrode 25 are displaced in the y direction to align slot 21 of suppression electrode 20 and slot 26 of ground electrode 25 with chamber aperture 11. Suppression electrode 20 further includes a suppression plug 23 disposed between slots 21 and 22. Suppression plug 23 is configured to have a shape that corresponds to the geometry of aperture 11 of source chamber 10. Suppression plug 23 may be integrally formed with suppression electrode 20 and may be made, for example, from tungsten. Suppression electrode 20 must be configured to have sufficient spacing away from and between slots 21 and 22 such that when either of these slots is aligned with aperture 11, suppression plug 23 does not interfere with the ion beam extracted from source chamber 10. This is illustrated in FIG. 2 which shows extraction of ion beam 30 from chamber 10 through low energy slot 21 of suppression electrode 20 and low energy slot 26 of ground electrode 25. The placement of suppression plug 23 between low energy slot 21 and high energy slot 22 does not interfere with beam 30 and provides no change to the equi-potential lines near slot 21 and thus, does not compromise the associated beam optics. Alternatively, suppression electrode 20 and ground electrode 25 may be aligned with source chamber 10 to accommodate ion beam extraction through high energy slots 22 and 26 respectively. Again, suppression plug 23 is disposed between low energy slot 21 and high energy slot 22 such that it does not interfere with the extracted ion beam through high energy slots 22 and 27. Although the description above references the use of suppression plug 23 with dual mode electrodes 20 and 25, suppression plug 23 may also be configured for use with a single mode suppression electrode. The placement of the suppression plug with the single mode suppression electrode is such as to not interfere with the extracted ion beam through the single mode slot.

Figure 3:
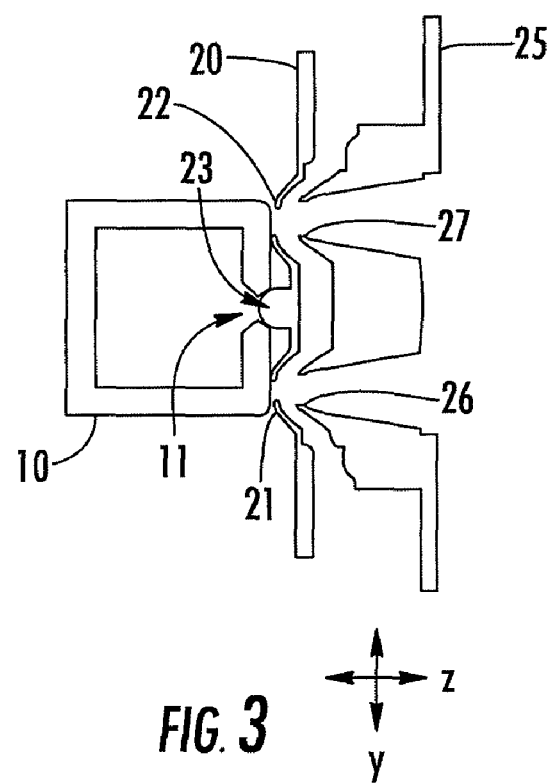
FIG. 3 is a cross sectional block diagram illustrating engagement of a suppression plug with an extraction aperture of the ion source in accordance with an embodiment of the present invention.

FIG. 3 is a cross sectional block diagram illustrating engagement of suppression plug 23 with extraction aperture 11 during source chamber cleaning. In particular, suppression electrode 20 is displaced in the y direction to align suppression plug 23 with source aperture 11. Suppression electrode 20 is further displaced in the z direction sufficiently to engage suppression plug 23 with source chamber aperture 11 to adjust the gas conductance through aperture 11. Once suppression plug 23 is positioned over or in close proximity to source aperture 11, a cleaning gas (for example, nitrogen triflouride ($NF_3$) or sulfur hexaflouride ($SF_6$)) is fed into the ion source chamber 10. This produces a plasma-enhanced chemical reaction inside source chamber 10 to etch away unwanted deposited material from the interior walls of the chamber. For example, nitrogen triflouride ($NF_3$) is typically used as a cleaning gas such that reactive atomic flourine is generated by the disassociation of $NF_3$ into nitrogen and flourine atoms. These reactive meta-stable atoms react with the unwanted deposits on the interior walls of chamber 10. By positioning suppression plug 23 proximally with aperture 11, the gas pressure inside the source chamber 10 can be increased significantly at a given flow rate. It has been found that increasing the chamber pressure between 100-1000 mTorr which is significantly higher than typical pressure ranges results in better cleaning efficiency. The position of suppression plug 23 may be adjusted depending on the pressure requirement inside source chamber 10 for optimum cleaning. For example, if a moderate pressure is required for cleaning, a reasonable gap between aperture 11 and suppression plug 23 can be set, thereby allowing the pressure inside source chamber 10 to increase as well as allowing etchant gas leakage. If maximum pressure is required for cleaning, then the position of suppression plug 23 can be periodically adjusted during the cleaning process from, for example, complete closure of aperture 11 to inhibit gas leakage to a certain distance from aperture 11 to allow leakage of the etched deposit material in gas form from chamber 10. The periodic movement of suppression plug 23 toward and away from aperture 11 may be adjusted, for example 1-100 times/min during the cleaning process. The cleaning gas which reacted with the ion beam escapes through aperture 11, thus removing the unwanted deposits via a gaseous waste stream. By incorporating the suppression plug 23 as part of suppression electrode 20, costly modifications to source chamber 11 or additional mechanical devices positioned between the chamber and the electrodes used to increase pressure within the chamber during cleaning are avoided. In this manner, by changing the configuration of suppression electrode 20, a means is provided to increase the pressure within source chamber 10 during cleaning cycles.

Figure 4:
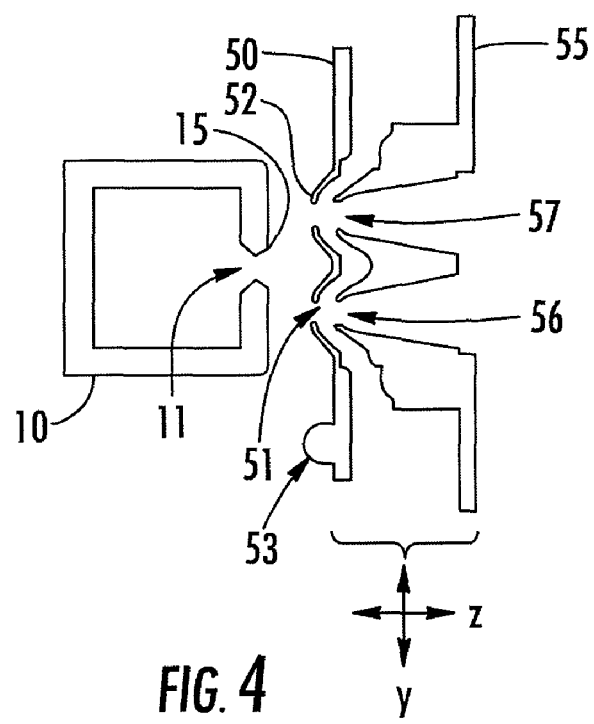
FIG. 4 is a cross sectional block diagram illustrating a suppression plug disposed at a first end of a suppression electrode in accordance with an embodiment of the present invention.

FIG. 4 is a cross sectional block diagram of another embodiment of the present invention in which a suppression plug 53 is disposed at a first end of suppression electrode 50. Suppression electrode 50 includes a first slot 51 to accommodate low energy ion beam extraction as well as a second slot 52 to accommodate high energy ion beam extraction. Similarly, ground electrode 55 is positioned downstream from suppression electrode 50 and likewise includes a low energy slot 56 for low energy ion beam extraction as well as a high energy slot 57 for high energy ion beam extraction. Suppression electrode 50 and ground electrode 55 are displaced at least in the y direction to align the respective slots with aperture 11 of ion source 10. In particular, when high energy beam current is generated using source chamber 10, suppression electrode 50 and ground electrode 55 are displaced in the y direction to align slot 52 of suppression electrode 50 and slot 57 of ground electrode 55 with chamber aperture 11. When low energy beam is extracted, suppression electrode 50 and ground electrode 55 are displaced in the y direction to align slot 51 of suppression electrode 50 and slot 56 of ground electrode 55 with chamber aperture 11.

Figure 5:
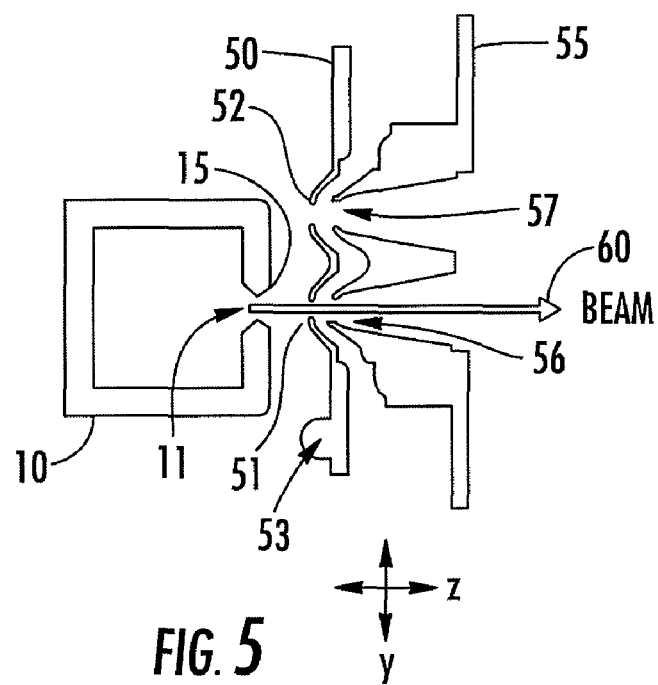
FIG. 5 is a cross sectional block diagram illustrating an ion beam extracted from an ion source in accordance with an embodiment of the present invention.

Similar to suppression plug 23 disclosed with reference to FIGS. 1-3, suppression plug 53 is configured to have a shape that corresponds to the geometry of aperture 11 of source chamber 10. Suppression plug 53 is disposed on the distal end of suppression electrode 50 a distance from low energy slot 51 and an even greater distance from high energy slot 52. By disposing suppression plug 53 at one end of suppression electrode 50, suppression plug 53 does not interfere with the ion beam extracted from source chamber 10 when either of the high or low energy slots is aligned with aperture 11. This is illustrated in FIG. 5 which shows extraction of ion beam 60 from chamber 10 through low energy slot 51 of suppression electrode 50 and low energy slot 56 of ground electrode 55. The placement of suppression plug 53 distal from low energy slot 51 of suppression electrode 50 does not interfere with or inhibit beam 60 and does not compromise the associated beam optics. Alternatively, suppression electrode 50 and ground electrode 55 may be aligned with source chamber 10 to accommodate ion beam extraction through high energy slots 52 and 56 respectively. Again, suppression plug 53 is disposed distal from low energy slot 51 of suppression electrode 50 such that it does not interfere with the extracted ion beam through high energy slot 52 and slot 57 of ground electrode 55. Although not illustrated in FIGS. 4-5, suppression plug 53 may also be disposed on suppression electrode 50 at a second end near high energy slot 52. Again, suppression plug 53 is positioned at the other end of suppression electrode 50 a sufficient distance away from high energy slot 52 such that the suppression plug 53 does not interfere with an ion beam extracted through high energy slot 52 of suppression electrode 50 and high energy slot 57 of ground electrode 55.

Figure 6:
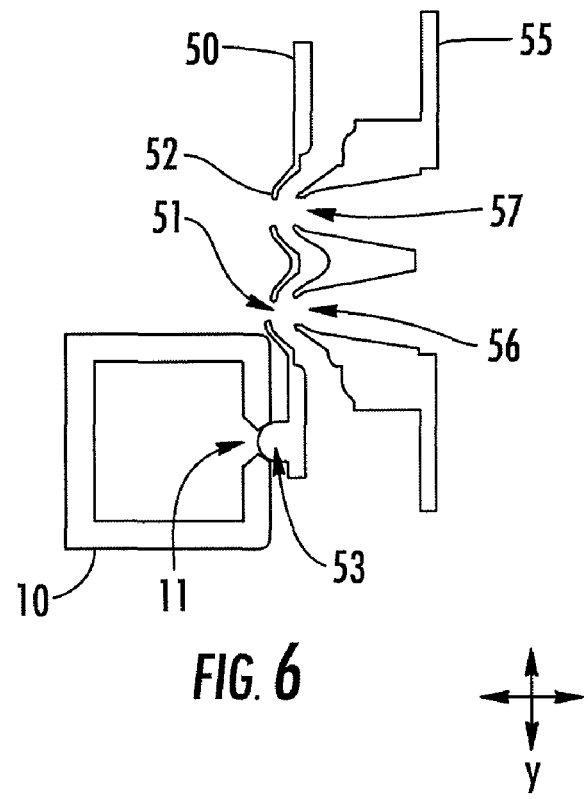
FIG. 6 is a cross sectional block diagram illustrating engagement of a suppression plug with an extraction aperture of the ion source in accordance with an embodiment of the present invention.

FIG. 6 is a cross sectional view illustrating engagement of suppression plug 53 against extraction aperture 11 during source chamber cleaning. In particular, suppression electrode 50 is displaced in the y direction to align suppression plug 53 with source aperture 11. Suppression electrode 50 is further displaced in the z direction to engage suppression plug 53 with source chamber aperture 11 to adjust gas conductance through aperture 11. Once suppression plug 53 is positioned over source aperture 11, a cleaning gas (for example, nitrogen triflouride ($NF_3$) or sulfur hexafluoride ($SF_6$)) is fed into the ion source chamber 10. Then plasma-enhanced chemical reaction inside the source chamber 10 occurs to etch away unwanted deposited material from the interior walls of the chamber as described above. By positioning suppression plug 53 proximally with aperture 11, the gas pressure inside the source chamber 10 can be increased significantly at a given flow rate. It has been found that increasing the chamber pressure between 100-1000 mTorr which is significantly higher than typical pressure ranges results in better cleaning efficiency. The position of suppression plug 53 may be adjusted depending on the pressure requirement inside source chamber 10 to inhibit or allow extraction of the cleaning gas from chamber 10 for optimum cleaning. For example, if a moderate pressure is required for cleaning, a reasonable gap between aperture 11 and suppression plug 53 can be set, thereby allowing the pressure inside source chamber 10 to increase as well as allowing etchant gas leakage. If maximum pressure is required for cleaning, then the proximity of suppression plug 53 to aperture 11 can be periodically adjusted during the cleaning process from, for example, complete closure of aperture 11 to inhibit gas leakage to a certain distance from aperture 11 in order to allow leakage of the etched deposit material in gas form away from chamber 10. It should be understood that the position of suppression plug 53 with respect to aperture 11 may be adjusted in various The periodic movement of suppression plug 23 toward and away from aperture 11 may be adjusted, for example 1-100 times/min during the cleaning process. The cleaning gas which reacted with the ion beam escapes through aperture 11, thus removing the unwanted deposits via a gaseous waste stream. In this manner, a suppression plug may be integrally formed with a suppression electrode to provide a means for reducing the amount of cleaning gas/plasma from escaping out of an ion source chamber during cleaning cycles. This increases the pressure within the ion source chamber, thereby increasing the cleaning efficiency of unwanted deposits on the interior walls of the ion source chamber.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An ion implanter comprising:
an ion source chamber having interior surfaces and an aperture through which ion beams are extracted, said source chamber configured to receive a cleaning gas to remove deposits from said interior surfaces;
an electrode positioned outside of said ion source chamber proximate to said aperture, said electrode having at least one slot providing an extraction path for said ion beam exiting said source chamber aperture; and
a suppression plug disposed on said electrode but distal from said slot, said electrode configured for displacement with respect to said ion source aperture wherein when said electrode is in a first position, said suppression plug allows said ion beam to be extracted through said slot uninhibited and when said electrode is in a second position, said suppression plug inhibits, at least partially, the extraction of said ion beam from said source chamber aperture to increase pressure within said chamber.

2. The ion implanter of claim 1 wherein the position of said electrode is periodically adjusted between said first and second positions.

3. The ion implanter of claim 1 wherein said electrode is in a third position such that said suppression plug engages said source chamber aperture.

4. The ion implanter of claim 3 wherein the position of said electrode is periodically adjusted between said first, second and third positions.

5. The ion implanter of claim 1 wherein said electrode is a suppression electrode.

6. The ion implanter of claim 1 wherein said slot is a first slot configured for extraction of a high energy ion beam, said electrode further comprising a second slot disposed a distance away from said first slot and configured for extraction of a low energy ion beam, said suppression plug disposed between said first and second slots.

7. The ion implanter of claim 1 wherein said slot is a first slot configured for extraction of a high energy ion beam, said electrode further comprising a second slot disposed a distance away from said first slot configured for extraction of a low energy ion beam, said suppression plug being disposed at a first end of said electrode a distance x from said first slot and a distance y from said second slot wherein x>y.

8. The ion implanter of claim 1 wherein said electrode is a suppression electrode, said implanter further comprising a ground electrode positioned downstream from said suppression electrode away from said ion source chamber.

9. The ion implanter of claim 1 wherein said slot is a first slot configured for extraction of a low energy ion beam, said electrode further comprising a second slot disposed a distance away from said first slot and configured for extraction of a high energy ion beam, said suppression plug being disposed at a first end of said electrode a distance x from said first slot and a distance y from said second slot wherein x<y.

10. A method of cleaning an ion source chamber in an ion implanter apparatus comprising:
introducing a cleaning gas into said ion source chamber;
ionizing said cleaning gas within said chamber; and
aligning an electrode with an extraction aperture of said ion source chamber such that a suppression plug associated with said electrode is positioned in close proximity to said aperture to at least partially inhibit the extraction of said cleaning gas from said chamber to increase the pressure within said ion source chamber.

11. The method of claim 10 further comprising adjusting the proximity of said suppression plug with respect to said aperture to further inhibit or allow extraction of said cleaning gas from said chamber.

12. The method of claim 10 further comprising adjusting the proximity of said suppression plug with respect to said aperture from a first position wherein said suppression plug closes said aperture to a second position wherein said suppression plug is a specified distance from said aperture such that cleaning gas leaks from said chamber via said aperture.

13. The method of claim 10 further comprising exhausting the ionized cleaning gas together with the etched deposits out of said ion source chamber.

14. The method of claim 10 wherein the step of aligning an electrode with an extraction aperture of said ion source chamber is performed while said cleaning gas is introduced into said ion source chamber.

15. The method of claim 10 further comprising controlling the temperature of said ion source chamber while said cleaning gas is introduced in said chamber.

16. The method of claim 10 further comprising controlling the flow rate of said cleaning gas into said ion source chamber.

17. An ion implanter comprising:
an ion source chamber having interior surfaces and an aperture through which ion beams are extracted, said source chamber configured to receive a cleaning gas to remove deposits from said interior surfaces;
an electrode positioned outside of said ion source chamber proximate to said aperture, said electrode having at least one slot providing an extraction path for said ion beam exiting said source chamber aperture; and
a suppression plug integrally formed with said electrode but distal from said slot, said electrode configured for displacement with respect to said ion source aperture wherein when said electrode is in a first position said suppression plug allows said ion beam to be extracted through said slot uninhibited and when said electrode is in a second position, said suppression plug inhibits, at least partially, the extraction of said ion beam from said source chamber aperture to increase pressure within said chamber.

18. The ion implanter of claim 17 wherein the position of said electrode is periodically adjusted between said first and second positions.

19. The ion implanter of claim 17 wherein said electrode is in a third position such that said suppression plug engages said source chamber aperture.

20. The ion implanter of claim 19 wherein the position of said electrode is periodically adjusted between said first, second and third positions.

* * * * *